(12) United States Patent
Zheng et al.

(10) Patent No.: US 6,452,843 B1
(45) Date of Patent: Sep. 17, 2002

(54) METHOD AND APPARATUS FOR TESTING HIGH-SPEED CIRCUITS BASED ON SLOW-SPEED SIGNALS

(75) Inventors: Hua Zheng, Fremont; Kamin Fei, Sunnyvale, both of CA (US)

(73) Assignee: Winbond Electronics Corporation, Hsin Chi (TW)

( * ) Notice: Subject to any disclaimer, the term of this patent is extended or adjusted under 35 U.S.C. 154(b) by 0 days.

(21) Appl. No.: 09/740,702

(22) Filed: Dec. 19, 2000

(51) Int. Cl.$^7$ ................................................ G11C 7/00
(52) U.S. Cl. .................. 365/191; 365/189.01; 365/226; 327/355; 327/225
(58) Field of Search ........................ 365/189.05, 189.01, 365/226, 191; 327/217, 225, 355, 143

(56) References Cited

U.S. PATENT DOCUMENTS

| | | | |
|---|---|---|---|
| 5,541,547 A | * 7/1996 | Lam | 327/355 |
| 5,828,596 A | * 10/1998 | Yakata et al. | 365/145 |
| 6,104,774 A | * 8/2000 | Yokomizo | 377/47 |
| 6,285,222 B1 | * 9/2001 | Kitade | 327/143 |

* cited by examiner

Primary Examiner—David Nelms
Assistant Examiner—Gene N. Auduong
(74) Attorney, Agent, or Firm—Dinh & Associates (57) ABSTRACT

Techniques and circuits for testing high-speed circuits using slow-speed input signals. Various designs for a "stimulus" generator are provided, which is capable of generating a high-speed stimulus based on, or in response to, one or more input signals. In one design, the generator includes two edge detectors coupled to a latch. Each edge detector receives a respective set of input signals and provides an intermediate signal. The latch receives the two intermediate signals from the two edge detectors and generates the output signal, which has a particular waveform pattern generated based on the active (e.g., leading) transitions in the two sets of input signals provided to the two edge detectors. In another design, the generator includes a ring oscillator that is enabled by one input signal, and further initiated by a pulse on another input signal provided to an input of a latch used to implement the oscillator.

27 Claims, 6 Drawing Sheets

METHOD AND APPARATUS FOR TESTING HIGH-SPEED CIRCUITS BASED ON SLOW-SPEED SIGNALS

BACKGROUND OF THE INVENTION

The present invention relates generally to integrated circuits, and more particularly to method and apparatus for testing high-speed circuits based on slow-speed signals.

Memory devices are integral to computer systems and many electronic circuits. Continuous improvements in the operating speed and computing power of central processing units (CPUs) enable the operation of an ever-greater variety of applications, many of which require larger and faster memories. Larger memories are characterized by having more memory cells to store more bits of data. And faster memories are possible by using smaller geometry for the memory cells and employing circuitry that ensures proper operation at the higher speed.

The manufacturing process for larger and faster memory devices is very challenging due to the complicated process to fabricate and test the devices. After fabrication, the memory devices are typically tested at the wafer level. Devices that pass wafer test are then assembled and tested at the final (package) level. Devices that fail at either wafer or final test are rejected.

Because resources are expended to package and final test a memory device, it is highly desirable to identify as many defective devices as possible during wafer test so that these devices are not unnecessarily packaged. To achieve this, as many circuits as possible within the devices should be tested at the wafer level. The devices typically include some circuits that may be tested using slow-speed stimulus, and may further include other circuits (e.g., delay lock loops) that may require higher speed stimulus for testing. However, some wafer test equipments are not capable of generating the higher speed stimulus due to various reasons such as, for example, parasitic loading on test probes.

Conventionally, due in limitations of the wafer test equipment, not all circuits within the memory devices may be tested at the wafer level. If a device passes wafer test, it is subsequently packaged. The circuits in the device not tested at wafer level are then tested at the package level using equipment capable of providing the required high-speed stimulus. However, by not testing these circuits at the wafer level, there is greater likelihood of finding defects in the circuits, and thus the device, at the package level. When defects are found for the first time at the package level, additional costs has been unnecessarily incurred in packaging and processing bad devices.

As can be seen, techniques that allow high-speed circuits within an integrated circuit to be tested using slow-speed stimulus are highly desirable.

SUMMARY OF THE INVENTION

The invention provides techniques and circuits for testing high-speed circuits using slow-speed input signals. These techniques and circuits can be advantageously used for various types of integrated circuit (IC) such as a DRAM, a synchronous graphics RAM, a processor, a controller, a digital signal processor (DSP), an application specific integrated circuit (ASIC), and others. In an aspect, various designs for a "stimulus" generator are provided, which is capable of generating a high-speed stimulus based on, or in response to, one or more slow-speed input signals. The high-speed stimulus is then used to test a high-speed circuit.

An embodiment of the invention provides a (stimulus) generator that generates an output signal (i.e., a high-speed stimulus) based on a number of (slow-speed) input signals. The generator includes first and second edge detectors coupled to a latch. Each edge detector receives a respective set of input signals and provides an intermediate signal. The latch receives the first and second intermediate signals from the first and second edge detectors and generates the output signal, which has a particular waveform pattern generated based on the active (e.g., leading) transitions in the two sets of input signals provided to the two edge detectors.

Each edge detector can be designed to include a number of pulse generators coupled to a gate. Each pulse generator receives a respective input signal and provides a pulse signal. The gate receives and combines the pulse signals from the pulse generators to generate the intermediate signal.

The input signals may be provided such that each input signal is associated with a timing offset that is different from timing offsets of other input signals. Each intermediate signal may include a sequence of pulses generated based on active transitions in the respective set of input signals. Each (leading and trailing) transition in the output signal may correspond to an active transition in one of the input signals.

Another embodiment of the invention provides a (stimulus) generator that generates an output signal (i.e., a high-speed stimulus) in response to at least one slow-speed input signal. The generator includes first, second, and third pulse generators, a delay circuit, and a latch. The delay circuit receives the output signal and provides a delayed signal. The first and second pulse generators receive the delayed signal and provide a pulse on the first and second signals, respectively, in response to leading and trailing transitions, respectively, in the delayed signal. The third pulse generator receives the input signal and provides a pulse on a third signal in response to a (e.g., leading) transition in the input signal. The generator is enabled by an enable signal and initiates operation based on the pulse on the third signal. The latch provides the output signal, which is set and reset based on the pulses in the first and second signals.

Various other aspects, embodiments, and features of the invention are described in further detail below.

The foregoing, together with other aspects of this invention, will become more apparent when referring to the following specification, claims, and accompanying drawings.

DESCRIPTION OF THE SPECIFIC EMBODIMENTS

Figure 1:
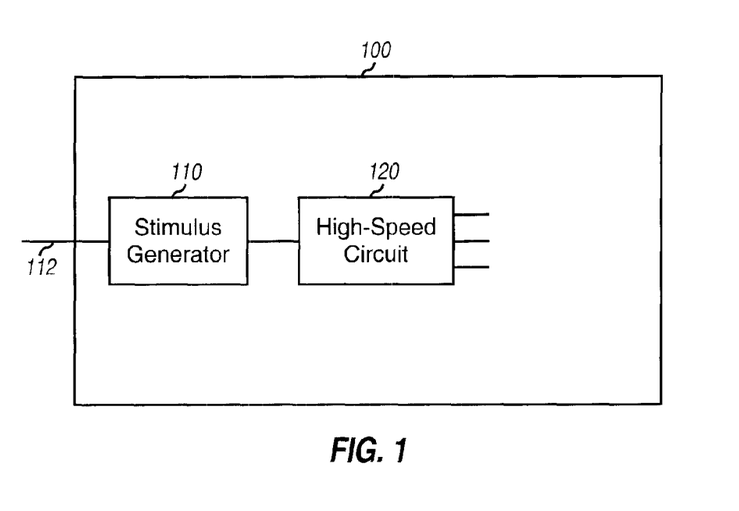
FIG. 1 is a simple block diagram of a device capable of testing a high-speed circuit using one or more slow-speed input signals.

FIG. 1 is a simple block diagram of a device 100 capable of testing a high-speed circuit 120 using one or more slow-speed input signals, in accordance with an aspect of the invention. Many integrated circuits include high-speed circuits that need to be tested during the manufacturing or engineering development phase. These high-speed circuits may require high-speed stimulus (e.g., a high-speed clock) for proper operation. However, due to test equipment limitations and/or other factors, it may not be possible to provide the necessary high-speed stimulus to the device under test. For example, a tester may only be able to provide signals having a maximum period of 64 nsec or slower. In this case, techniques to test the high-speed circuit based on one or more slow-speed signals would be highly desirable.

As shown in FIG. 1, a stimulus generator 110 receives one or more slow-speed signals 112 and, in response, generates the necessary high-speed stimulus (e.g., a clock signal) to test high-speed circuit 120. As described in further detail below, various designs can be used for stimulus generator 110. The slow-speed signals may be used to generate the high-speed stimulus or to trigger the generation of the high-speed stimulus.

Figure 2A:
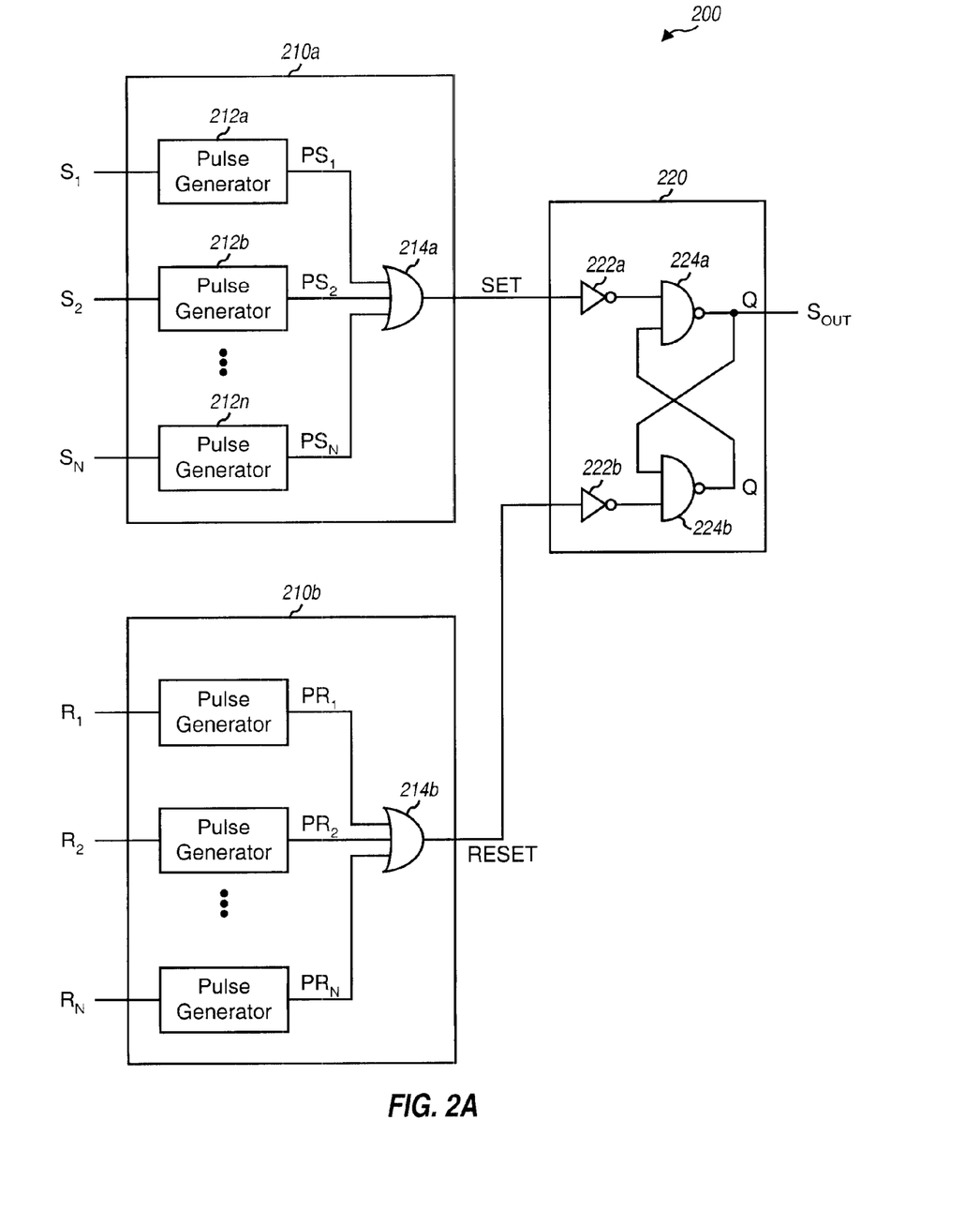
FIG. 2A is a schematic diagram of an embodiment of a stimulus generator capable of generating a high-speed stimulus based on a number of slow-speed input signals.

FIG. 2A is a schematic diagram of an embodiment of a stimulus generator 200 capable of generating a high-speed stimulus based on a number of slow-speed input signals. Stimulus generator 200 is one specific design for stimulus generator 110 in FIG. 1. In this specific design, stimulus generator 200 includes a pair of edge detectors 210a and 210b coupled to a latch 220. Each edge detector 210 includes N pulse generators 212a through 212n coupled to an N-input OR gate 214, where N can be any integer greater than or equal to two (i.e., N≧2). Each pulse generator 212 receives a respective slow-speed input signal ($S_X$ or $R_X$, where x is 1, 2, . . . or N) and generates a pulse for each "active" transition in the received slow-speed signal. An active transition may be a rising edge or a falling edge, depending on the particular design of the circuit being applied with the signal. These pulses are subsequently used to generate the desired waveform pattern for the high-speed stimulus $S_{OUT}$, as described in further detail below.

Latch 220 includes inverters 222a and 222b and NAND gates 224a and 224b. The inputs of inverters 222a and 222b respectively comprise the set and reset inputs of latch 220, and further respectively receive the signals SET and RESET. The output of inverter 222a couples to one input of NAND gate 224a, and the other input of NAND gate 224a couples to the output of NAND gate 224b. Similarly, the output of inverter 222b couples to one input of NAND gate 224b, and the other input of NAND gate 224b couples to the output of NAND gate 224a.

In the specific design shown in FIG. 2A, edge detector 210a generates a signal SET having a series of pulses used to "set" the output stimulus $S_{OUT}$ (e.g., to logic high). Similarly, edge detector 210b generates a signal RESET having a series of pulses used to "reset" the output stimulus $S_{OUT}$ (e.g., to logic low). Latch 220 receives the signals SET and RESET at its set and reset inputs, respectively, and generates the output stimulus $S_{OUT}$ based on the received signals. A design of pulse generator 212 and the operation of edge detector 210 and latch 220 are described in further detail below.

The slow-speed signals, $S_1$ through $S_N$ and $R_1$ through $R_N$, may have (relatively) long periods, but the edges (i.e., transitions) on these signals may be accurately controlled. By providing the proper slow-speed waveform patterns on the signal lines $S_X$ and $R_X$, a high-speed stimulus with any particular waveform pattern may be generated. For example, a high-speed clock may be generated based on properly time-offsetted (i.e., skewed) slow-speed clocks on the signal lines $S_X$ and $R_X$, as described in further detail below.

Figure 2B:
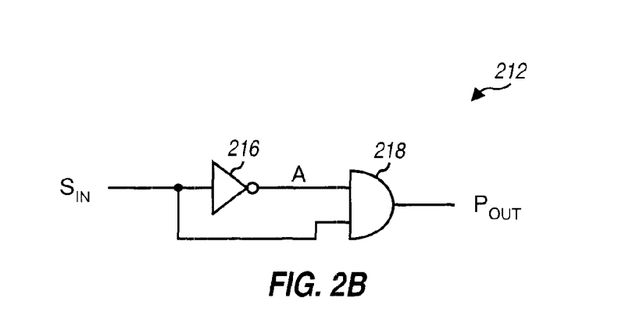
FIG. 2B is a schematic diagram of an embodiment of a pulse generator.

FIG. 2B is a schematic diagram of an embodiment of pulse generator 212, which includes an inverter 216 and an AND gate 218. The input of inverter 216 and one input of AND gate 218 receive the input signal $S_{IN}$, which can be one of the slow-speed signals shown in FIG. 2A. The output of inverter 216 couples to the other input of AND gate 218, and the output of AND gate 218 provides the output signal $P_{OUT}$.

Figure 2C:
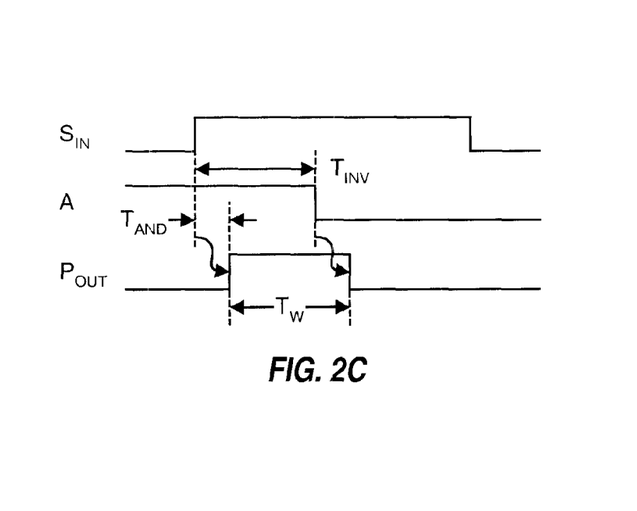
FIG. 2C is a timing diagram that illustrates the operation of the pulse generator.

FIG. 2C is a timing diagram that illustrates the operation of pulse generator 212. Initially, the input signal $S_{IN}$ is at logic low, the output of inverter 216 is at logic high, and the output of AND gate 218 is at logic low. When the input signal $S_{IN}$ transitions to logic high, the output of AND gate 218 also transitions to logic high a short delay ($T_{AND}$) later since both gate inputs are now at logic high. $T_{AND}$ is the propagation delays of AND gate 218.

In response to the input signal $S_{IN}$ transitioning to logic high, the output of inverter 216 transitions to logic low a particular time ($T_{INV}$) later, with $T_{INV}$ being the propagation delays of the inverter. In response to the output of inverter 216 transitioning to logic low, the output of AND gate 218 transitions to logic low a short delay ($T_{AND}$) later. A pulse is thus generated on the output signal $P_{OUT}$ by pulse generator 212 based on a leading (rising) transition in the input signal $S_{IN}$. The width of the pulse is determined by the amount of delays introduced by inverter 216. A wider pulse width may be obtained by increasing the delays of inverter 216 (e.g., by cascading a number of inverters in series). As also shown in FIG. 2C, no pulse is generated on the output signal $P_{OUT}$ for a trailing (falling) edge in the input signal $S_{IN}$.

Figure 3:
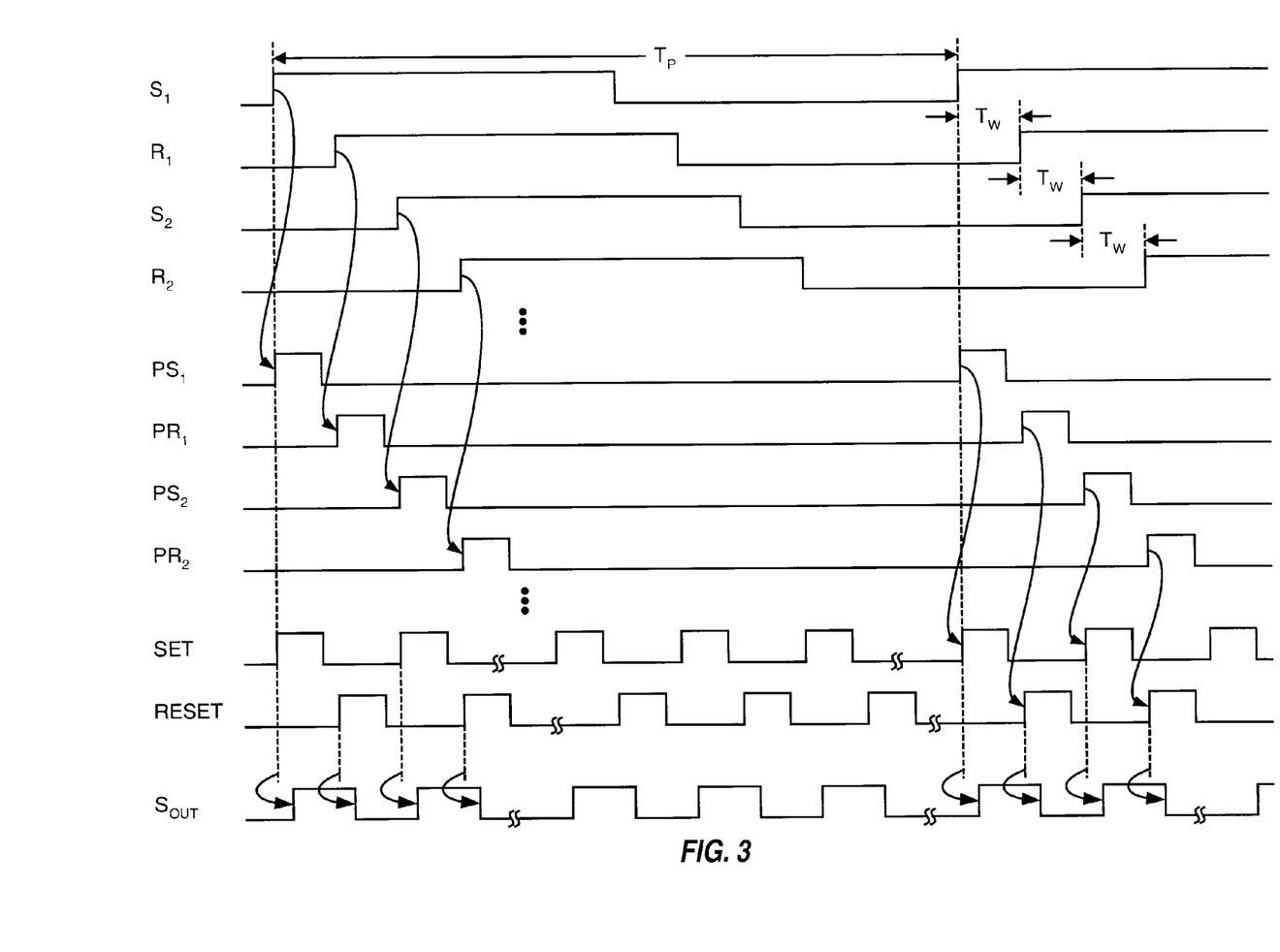
FIG. 3 is a timing diagram that illustrates the operation of the stimulus generator shown in FIG. 2A.

FIG. 3 is a timing diagram that illustrates the operation of stimulus generator 200 to generate a high-speed stimulus of a particular waveform pattern (e.g., a square wave). The top of FIG. 3 shows four slow-speed signals $S_1$, $S_2$, $R_1$, and $R_2$ used to generate pulses that are then used to generate the high-speed output stimulus. Additional slow-speed signals may also be used but are not shown in FIG. 3 for simplicity. As FIG. 3 illustrates, the slow-speed signals have (relatively) long periods but the timing of their leading (rising) edges may be accurately controlled. In this example, the rising edges of the four input signals are shown as being staggered by a particular amount ($T_W$).

Referring back to FIG. 2A, the input signals $S_1$ and $S_2$ are provided to pulse generators 212a and 212b, respectively, within edge detector 210a. Similarly, the input signals $R_1$ and $R_2$ are provided to two pulse generators within edge detector 210b. Each pulse generator 212 generates a pulse for each rising edge in the received input signal. The signals $PS_1$ and $PS_2$ from pulse generators 212a and 212b, respectively, are provided to two inputs of OR gate 214, and are ORed together to generate the signal SET. Similarly, the signals $PR_1$ and $PR_2$ from two pulse generators are provided to two inputs of OR gate 214b, and are ORed together to generate the signal RESET.

As shown in FIG. 3, the signal SET includes the pulses generated from input signals $S_1$ through $S_N$, and the signal RESET includes the pulses generated from input signals $R_1$ through $R_N$. As also shown in FIG. 3, for proper operation of the specific design of latch 220, the pulses generated from the input signals $S_X$ and $R_X$ to not overlap. This can be achieved by setting the propagation delays of inverter 216 within pulse generator 212 to be less than the skews between the rising edges in the input signals (i.e., $T_{INT}<T_W$).

Latch 220 operates as follows. Initially, the signals SET and RESET are both at logic low, the outputs of inverters 222a and 222b are at logic high, the output of NAND gate 224a is at logic low, and the output of NAND gate 224b is at logic high. This is a stable initial state for latch 220.

When the signal SET transitions to logic high, the output of inverter 222a transitions to logic low, which then causes the output of NAND gate 224a to transition to logic high (i.e., setting the latch output). Both inputs of NAND gate 224b are then at logic high, which causes the output of NAND gate 224b to transition to logic low. When the signal SET transitions back to logic low at the end of the pulse, the output of inverter 222a transitions to logic high. However, since the other input of NAND gate 224a is already at logic low, the output of NAND gate 224a remains at logic high. The rising edge of the pulse on the signal SET thus sets the output of latch 220 to logic high.

When the signal RESET transitions to logic high, the output of inverter 222b transitions to logic low, which then causes the output of NAND gate 224b to transition to logic high. Both inputs of NAND gate 224a are then at logic high, which causes the output of NAND gate 224a to transition to logic low (i.e., resetting the latch output). When the signal RESET transitions back to logic low at the end of the pulse, the output of inverter 222b transitions to logic high. However, since the other input of NAND gate 224b is already at logic low, the output of NAND gate 224b remains at logic high. The rising edge of the pulse on the signal RESET thus resets the output of latch 220 to logic low.

As shown in FIG. 3, the signal SET includes a series of pulses, with the rising edges of these pulses being generated by the rising edges on the input signals $S_1$ through $S_N$ (only two input signals are shown). Similarly, the signal RESET includes a series of pulses, with the rising edges of these pulses being generated by the rising edges on the input signals $R_1$ through $R_N$. The rising edges of the pulses on the signal SET are used to set the high-speed stimulus $S_{OUT}$, and the rising edges of the pulses on the signal RESET are used to reset the stimulus $S_{OUT}$.

By properly generating the input signals, $S_1$ through $S_N$ and $R_1$ through $R_N$, any waveform pattern can be generated for the high-speed stimulus $S_{OUT}$. For example, by skewing the rising edges of the input signals, $S_1$, $R_1$, $S_2$, and so on, through $R_N$, by approximately the same amount (i.e., $T_W$, where $T_W=T_P/2N$), a clock signal having approximately 50% duty cycle is generated for the stimulus $S_{OUT}$. The duty cycle may be set by adjusting the timing skews between the input signals $S_X$ and $R_X$. For example, the skew between $S_1$ and $R_1$ may be set at $T_{W1}$, and the skew between $R_1$ and $S_2$ may be set at $T_{W2}$, where $T_{W1} \neq T_{W2}$ and $T_{W1}+T_{W2}=T_P/N$, and the duty cycle is $T_{W1}/(T_{W1}+T_{W2})$.

As can be seen, other waveform patterns may also be generated for the high-speed stimulus $S_{OUT}$. This can be achieved by providing a rising edge at the appropriate time on one of the input signals $S_X$ for each rising edge in the stimulus $S_{OUT}$, and providing a rising edge at the appropriate time on one of the input signals $R_X$ for each falling edge in the stimulus $S_{OUT}$.

Figure 4:
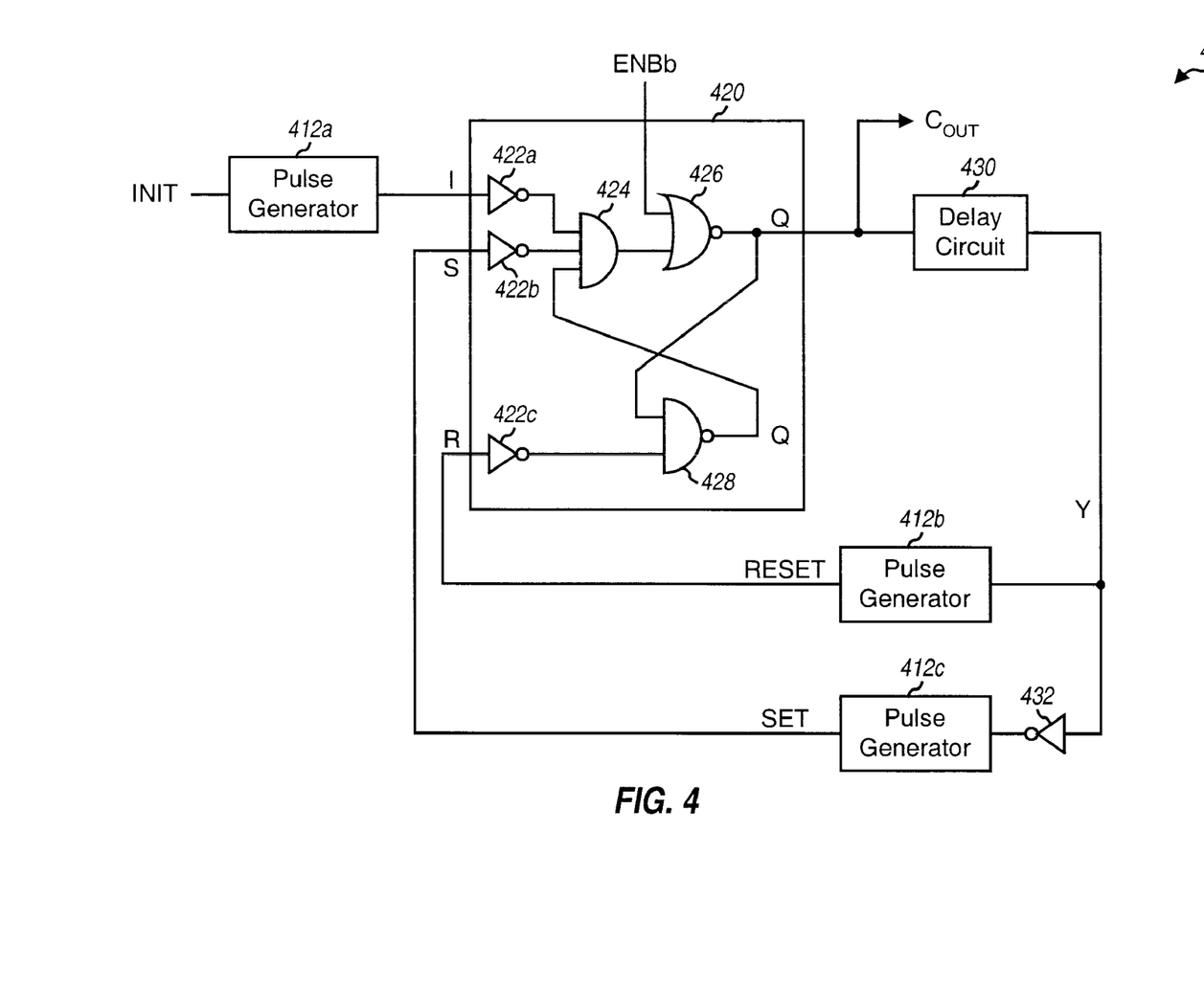
FIG. 4 is a schematic diagram of an embodiment of another stimulus generator capable of generating a high-speed stimulus in response to a slow-speed input signal.

FIG. 4 is a schematic diagram of an embodiment of a stimulus generator 400 capable of generating a high-speed stimulus in response to a slow-speed input signal. Stimulus generator 400 may also be used for stimulus generator 110 in FIG. 1. Stimulus generator 400 receives a signal ENBb that enables the operation of the generator and a signal INIT that initiates the operation of the generator, as described in further detail below. If enabled and once initiated, stimulus generator 400 provides a high-speed stimulus (e.g., a clock signal) having a period that may be selectable, depending on the particular design of the generator.

In the specific design shown in FIG. 4, stimulus generator 400 includes pulse generators 412a, 412b, and 412c, a latch 420, a delay circuit 430, and an inverter 432. Pulse generator 412a receives the signal INIT at its input and has its output coupled to an initiate (I) input of latch 420. The reset (R) and set (S) inputs of latch 420 respectively couple to the outputs of pulse generators 412b and 412c, and the output of latch 420 couples to the input of delay circuit 430 and further provides the high-speed output stimulus $C_{OUT}$. The output of delay circuit 430 couples to the input of pulse generator 412b and to the input of inverter 432. And the output of inverter 432 couples to the input of pulse generator 412c.

Latch 420 includes inverters 422a, 422b, and 422c, an AND gate 424, a NOR gate 426, and a NAND gate 428. The inputs of inverters 422a, 422b, and 422c respectively comprise the I, S, and R inputs of latch 420. The outputs of inverters 422a and 422b couple to two inputs of AND gate 424 and the output of NAND gate 428 couples to the third input of AND gate 424. The output of AND gate 424 couples to an input of NOR gate 426, and the other input of NOR gate 426 receives the signal ENBb. The output of NOR gate 426 comprises the output of latch 420. NAND gate 428 has an input that couples to the output of inverter 422c and another input that couples to the output of NOR gate 426.

Pulse generators 412a, 412b, and 412c may each be implemented as shown in FIG. 2B. Each pulse generator 412 provides a (logic high) pulse for each rising edge in the signal received at its input. As noted above, a wider pulse width may be obtained by increasing the propagation delays through inverter 216.

Figure 5A:
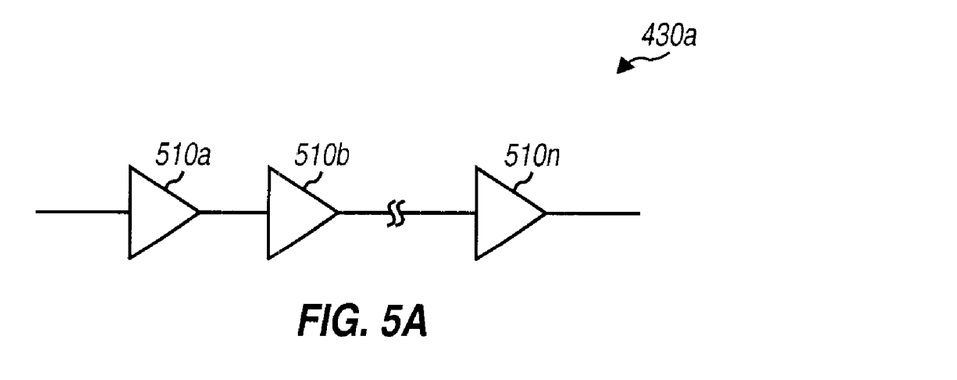
FIGS. 5A and 5B are schematic diagrams of two embodiments of a delay circuit.

FIG. 5A is schematic diagram of an embodiment of a delay circuit 430a, which is one implementation of delay circuit 430 in FIG. 4. Delay circuit 430a includes a number of buffers 510a through 510n coupled in series. Inverters may also be used in place of the buffers. For this simple design, the total delays provided by delay circuit 430a is generally fixed, and is equaled to the accumulated delays through the series coupled buffers 510. For a given fabrication process, variations in temperature, voltage, and process typically result in variations in the amount of delays provided by delay circuit 430a.

Figure 5B:
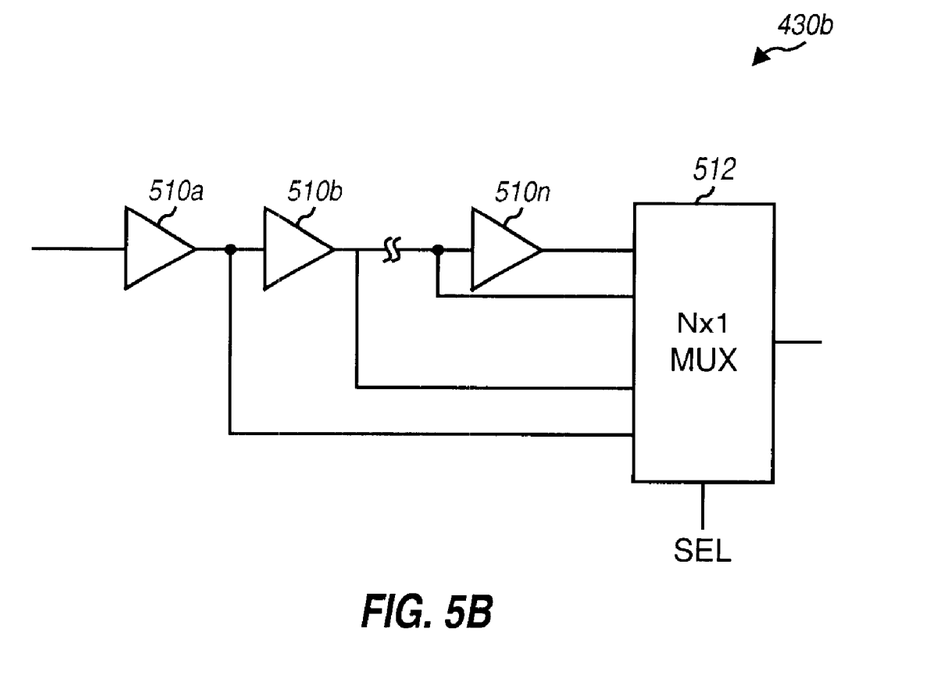

FIG. 5B is schematic diagram of an embodiment of a delay circuit 430b, which is another implementation of delay circuit 430 in FIG. 4. Delay circuit 430b includes a number of buffers 510a through 510n coupled in series, similar to delay circuit 430a. However, delay circuit 430b further includes a multiplexer 512 that couples to the outputs from buffers 510a through 510n. Multiplexer 512 receives the delayed signals from buffers 510a through 510n and provides one of the received signals as the output signal, as selected by a control signal SEL. Thus, different (e.g., selectable) amounts of delays may be provided by delay circuit 430b depending on which buffer output is selected by the signal SEL.

Figure 6:
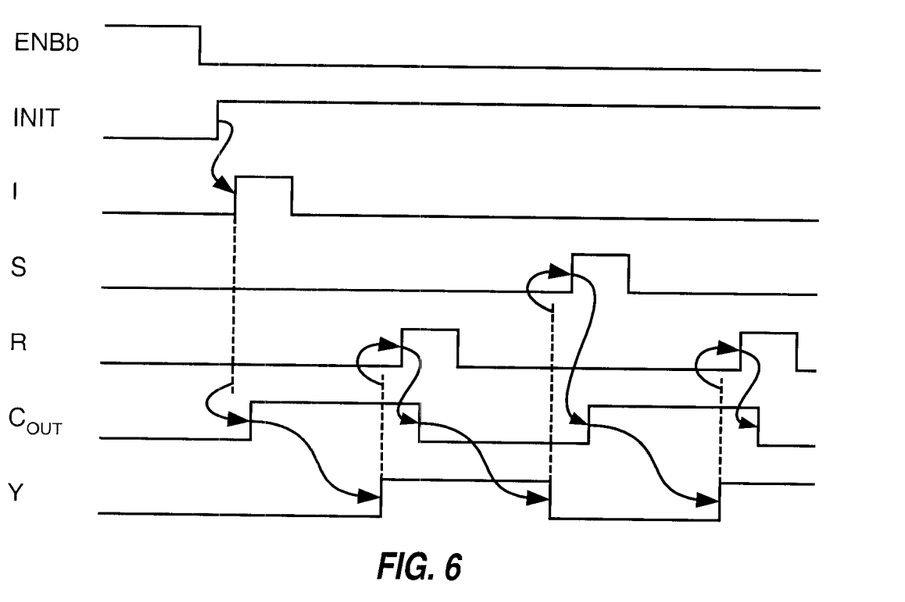
FIG. 6 is a timing diagram that illustrates the initiation and operation of the stimulus generator shown in FIG. 4.

FIG. 6 is a timing diagram that illustrates the initiation and operation of stimulus generator 400. Initially, the enable signal ENBb is at logic high, which (as shown in FIG. 4) forces the output of NOR gate 426 to logic low and disables stimulus generator 400. Once the enable signal ENBb transitions to logic low, NOR gate 426 effectively operates as an inverter that inverts the signal provided on the other input of the NOR gate. Stimulus generator 400 is thus enabled by the logic low on the signal ENBb.

Prior to being enabled by the signal ENBb, the output of latch 420 is at logic low, the outputs of pulse generators 412a, 412b, and 412c are all at logic low, the outputs of inverters 422a, 422b, and 422c are all at logic high, the output of NOR gate 426 is at logic low (due to the logic high on the signal ENBb), the output of NAND gate 428 is at logic high, and the output of AND gate 424 is at logic high. When the enable signal ENBb transitions to logic low, the initiate state of latch 420 is retained since the output of AND gate 424 is initially at logic high.

To initiate the operation of stimulus generator 400, the signal INIT is brought from logic low to logic high. This rising edge in the signal INIT causes pulse generator 412a to generate a single (high) pulse, which is provided to the I input of latch 420. This high pulse causes the output of AND gate 424 to transition to logic low, which then causes the output of NOR gate 426 to transition to logic high (as shown in FIG. 6), thereby setting the output of latch 420. The logic high at the output of NOR gate 426 causes the output of NAND gate 428 to transition to logic low. When the pulse on the I input of latch 420 later transitions back to logic low, the output of AND gate 424 remains at logic low because of the logic low at the output of NAND gate 428.

The rising edge on the output of NOR gate 426 is delayed by delay circuit 430, and the delayed signal Y is provided to the inputs of pulse generator 412b and inverter 432. This rising edge causes pulse generator 412b to generate a high pulse, which is provided to the R input of latch 420. Since inverter 432 inverts the rising edge on the delayed signal Y to a falling edge, pulse generator 412c effectively generates a high pulse for each falling edge on the delayed signal Y, and does not generate a pulse for the rising edge. Inverter 432 may be integrated within pulse generator 412c, but is shown separately to better describe the operation of generator 400.

The high pulse on the R input of latch 420 causes the output of inverter 422c to transition to logic low, which then causes the output of NAND gate 428 to transition to logic high. After the initial pulse from pulse generator 412a has passed, the output of pulse generator 412a is at logic low (as shown in FIG. 6), and the output of inverter 622a is at logic high. Thus, the high output from NAND gate 428 causes AND gate 424 to transition to logic high, which then causes the output of NOR gate 426 to transition to logic low. The high pulse from pulse generator 412b thus resets the output of latch 420 to logic low.

Similarly, the falling edge on the output of NOR gate 426 is delayed by delay circuit 430. The delayed falling edge then causes pulse generator 412c to generate a high pulse, which is provided to the S input of latch 420 (no pulse is generate by pulse generator 412b for the falling edge). The high pulse on the S input of latch 420 causes the output of inverter 422b to transition to logic low, which causes the output of AND gate 424 to transition to logic low, which further causes the output of NOR gate 426 to transition to logic high. Thus, the high pulse from pulse generator 412c sets the output of latch 420 to logic high.

As shown in FIG. 6, a rising (or falling) edge at the output of latch 420 propagates through delay circuit 430 and causes pulse generator 412b (or 412c) to generate a high pulse. This high pulse then causes latch 420 to reset (or set) to the opposite state. The propagation delays through delay circuit 430, pulse generator 412b or 412c, and latch 420 determine the duration (i.e., the width) of the high and low cycles of the output stimulus $C_{OUT}$. The propagation delays of pulse generators 412b and 412c and latch 420 are generally fixed for a given design and fabrication process. The widths of the high and low cycles (and thus the frequency) of the output stimulus $C_{OUT}$ may be adjusted by controlling the delays through delay circuit 430.

As shown in FIG. 5B, the amount of delays provided by delay circuit 430b may be selected (in discrete units) with the signal SEL. The frequency of the output stimulus $C_{OUT}$ may thus be controlled (also in discrete steps) by selecting the proper amount of delays to be provided by delay circuit 430b. This allows for the generation of a stimulus signal at or near a desired frequency even with process, supply, and temperature variations.

Different waveform patterns may also be generated for the high-speed stimulus $C_{OUT}$ by controlling the amount of delays from edge to edge. For example, delay circuit 430b may be programmed to provide delays of $T_{W1}$, $T_{W2}$, $T_{W3}$, and so on, through $T_{WN}$ for the N successive edges on the signal received at its input. The delays $T_{W1}$ would determine the width of the first high cycle in the stimulus $C_{OUT}$, the delays $T_{W2}$ would determine the width of the next low cycle, the delays $T_{W3}$ would determine the width of the next high cycle, and so on. A state machine may be implemented to generate the proper sequence of values for the control signal SEL to obtain the desired waveform pattern.

FIGS. 2A and 4 show two specific designs of a stimulus generator that may be used to generate a high-speed stimulus needed to test a high-speed circuit within an integrated circuit. Stimulus generator 200 in FIG. 2A utilizes a number of slow-speed signals to generate the high-speed stimulus $S_{OUT}$, while stimulus generator 400 in FIG. 4 utilizes a slow-speed signal to initiate (or activate) the generation of the output stimulus $C_{OUT}$.

Stimulus generator 200 may provide additional flexibility since any waveform pattern may be generated by providing a set of properly skewed slow-speed signals. However, a number of signal lines (and possibly device pins) are needed to provide the slow-speed signals, which may reduce the number of signal lines (and possibly device pins) available for other uses (e.g., to test other circuits). Stimulus generator 400 requires fewer signal lines (e.g., an enable signal ENBb and an initiate signal INIT) to enable the generation of the output stimulus $C_{OUT}$. However, stimulus generator 400 may have less flexibility in the number and type of waveform patterns that may be generated, and the timing of these waveforms. An integrated circuit may be designed with stimulus generator 200 or stimulus generator 400, or a combination of both.

The techniques and circuits described herein for testing high-speed circuits using slow-speed input signals can be advantageously used for various types of integrated circuit (IC) such as, for example, a dynamic random access memory (DRAM) IC, a synchronous graphics RAM (SGRAM), other memory devices, a processor, a controller, a digital signal processor (DSP), an application specific integrated circuit (ASIC), and others.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein, and as defined by the following claims.

What is claimed is:

1. A generator comprising:

a plurality of first circuits, each first circuit including a plurality of pulse generators configured to receive a plurality of input signals and provide a plurality of pulse signals used to generate an intermediate signal having leading transitions determined based on active transitions in the plurality of input signals; and a second circuit coupled to the plurality of first circuits, and configured to receive a plurality of intermediate signals from the plurality of first circuits and provide an output signal having a particular waveform pattern determined based on the active transitions in the plurality of input signals, wherein the output signal further includes more active transitions than each of the plurality of input signals.

2. The generator of claim 1, wherein the second circuit comprises a latch.

3. The generator of claim 2, wherein the latch is configured to receive a first intermediate signal at a first input and a second intermediate signal at a second input and to provide the output signal that is set and reset based on the first and second intermediate signals.

4. The generator of claim 1, wherein the output signal approximates a square wave having a periodicity that is 1/N a periodicity of the input signals, where N is an integer greater than one.

5. The generator of claim 1, wherein the plurality of input signals have similar periodicity, and wherein each input signal is associated with a timing offset that is different from timing offsets of remaining input signals.

6. The generator of claim 1, wherein the output signal has a periodicity that is related to a periodicity of the input signals.

7. The generator of claim 1, wherein each transition in the output signal correspond to an active transition in one of the input signals.

8. The generator of claim 7, wherein an active transition corresponds to a leading transition.

9. The generator of claim 1, wherein the intermediate signal from each first circuit comprises a sequence of pulses generated based on active transitions in a set of input signals received by the first circuit.

10. A signal generator comprising:

first and second edge detectors configured to receive first and second sets of input signals and provide first and second intermediate signals, each edge detector including a plurality of pulse generators, each pulse generator configured to receive a respective input signal and provide a pulse signal for each active transition in the input signal, and a gate coupled to the pulse generators and configured to receive pulse signals from the pulse generators and provide an intermediate signal; and a latch coupled to the first and second edge detectors, and configured to receive the first and second intermediate signals and provide an output signal having a particular waveform pattern generated based on active transitions in the first and second sets of input signals.

11. An integrated circuit comprising at least one signal generator, each signal generator including a plurality of first circuits, each first circuit including a plurality of pulse generators configured to receive a plurality of input signals and provide a plurality of pulse signals used to generate an intermediate signal having leading transitions determined based on active transitions in the plurality of input signals; and a second circuit coupled to the plurality of first circuits, and configured to receive a plurality of intermediate signals from the plurality of first circuits and provide an output signal having a particular waveform pattern determined based on the active transitions in the plurality of input signals, wherein the output signal further includes more active transitions than each of the plurality of input signals.

12. A dynamic random access memory (DRAM) device comprising at least one signal generator, each signal generator including a plurality of first circuits, each first circuit including a plurality of pulse generators configured to receive a plurality of input signals and provide a plurality of pulse signals used to generate an intermediate signal having leading transitions determined based on active transitions in the plurality of input signals; and a second circuit coupled to the plurality of first circuits, and configured to receive a plurality of intermediate signals from the plurality of first circuits and provide an output signal having a particular waveform pattern determined based on the active transitions in the plurality of input signals, wherein the output signal further includes more active transitions than each of the plurality of input signals.

13. A method for providing an output signal based on a plurality of input signals, the method comprising:

receiving a first set of input signals;

generating a first intermediate signal having a sequence of active transitions generated based on active transitions in the input signals in the first set;

receiving a second set of input signals;

generating a second intermediate signal having a sequence of active transitions generated based on active transitions in the input signals in the second set; and generating the output signal having a particular waveform pattern generated based on the active transitions in the first and second intermediate signals.

14. The method of claim 13, wherein each leading transition in the output signal corresponds to an active transition in the first intermediate signal and each trailing transition in the output signal corresponds to an active transition in the second intermediate signal.

15. A generator configured to receive at least one input signal and provide an output signal in response thereto, the generator comprising:

a delay circuit configured to receive the output signal and provide a delayed signal;

first and second pulse generators operatively coupled to the delay circuit and configured to receive the delayed signal and provide first and second signals, respectively; and a third circuit coupled to the first and second pulse generators, and configured to receive the first and second signals and a third signal generated based on a first input signal and, in response thereto, provide the output signal having a periodicity faster than a periodicity of the first input signal.

16. The generator of claim 15, further comprising:
a third pulse generator configured to receive the first input signal and provide the third signal.

17. The generator of claim 16, wherein the third pulse generator generates a pulse on the third signal in response to an active transition on the first input signal.

18. The generator of claim 15, wherein the first pulse generator is configured to provide a pulse on the first signal in response to a leading transition in the delayed signal, and wherein the second pulse generator is configured to provide a pulse on the second signal in response to a trailing transition in the delayed signal.

19. The generator of claim 15, wherein the third circuit comprises a latch.

20. The generator of claim 19, wherein operation of the latch is enabled by a second input signal received at an enable input of the latch.

21. The generator of claim 19, wherein the latch is configured to receive the first signal at a first input and the second signal at a second input and to provide the output signal that is set and reset based on the first and second signals.

22. The generator of claim 15, wherein the delay circuit is configured to provide a series of delays used to provide a particular waveform pattern on the output signal.

23. The generator of claim 15, wherein the delay circuit is configured to provide a fixed amount of delay.

24. The generator of claim 15, wherein the delay circuit is configured to provide a selectable amount of delay.

25. A generator configured to receive at least one input signal and provide an output signal in response thereto, the generator comprising:
a delay circuit configured to receive the output signal and provide a delayed signal;
a first pulse generator coupled to the delay circuit and configured to receive the delayed signal and provide a pulse on a first signal in response to a leading transition in the delayed signal;
a second pulse generator coupled to the delay circuit and configured to receive the delayed signal and provide a pulse on a second signal in response to a trailing transition in the delayed signal;
a third pulse generator configured to receive a first input signal and provide a pulse on a third signal in response to an active transition in the first input signal; and
a latch coupled to the first, second, and third pulse generators and the delay circuit, and configured to provide the output signal that is set and reset based on the first and second signals, wherein the latch is further enabled based on an enable signal, and wherein the generator initiates operation based on the pulse on the third signal.

26. A method for providing an output signal based on at least one input signals, the method comprising:
delaying the output signal to provide a delayed signal;
generating a pulse on a first signal in response to a leading transition in the delayed signal;
generating a pulse on a second signal in response to a trailing transition in the delayed signal;
receiving a first input signal;
generating a pulse on a third signal in response to an active transition in the first input signal;
initiating generation of a particular waveform pattern on the output signal in response to the pulse on the third signal; and
setting and resetting the output signal based on pulses on the first and second signals, respectively.

27. The method of claim 26, further comprising:
adjusting delay for the delayed signal to obtain the particular waveform pattern.

* * * * *